United States Patent [19]

Fisk et al.

[11] 4,055,800
[45] Oct. 25, 1977

[54] TEST CLIP FOR ELECTRONIC CHIPS

[75] Inventors: Charles S. Fisk, Boston; Dietrich Jung, Belmont, both of Mass.

[73] Assignee: Dietrich Jung, Newton, Mass.

[21] Appl. No.: 677,757

[22] Filed: Apr. 16, 1976

[51] Int. Cl.$^2$ .................. G01R 31/02; G01R 1/06
[52] U.S. Cl. .................. 324/72.5; 324/158 F; 339/75 MP; 339/74 R; 324/158 P
[58] Field of Search ........... 324/72.5, 158 F, 158 P; 339/74 R, 75 R, 75 MP, 176 MP, 17 CF

[56] References Cited

U.S. PATENT DOCUMENTS

| | | | |
|---|---|---|---|
| 3,412,327 | 11/1968 | Murray | 324/72.5 |
| 3,551,878 | 12/1970 | Rossman | 339/75 |
| 3,555,488 | 1/1971 | McIver et al. | 339/75 |
| 3,611,259 | 10/1971 | Palecek | 339/74 R |
| 3,968,433 | 7/1976 | Dobarganes | 324/158 F |

*Primary Examiner*—Rudolph V. Rolinec
*Assistant Examiner*—Vincent J. Sunderdick
*Attorney, Agent, or Firm*—Morse, Altman, Oates & Bello

[57] ABSTRACT

For testing electronic chips, an integral plastic test clip comprises a pair of opposed jaws that are pivotal relative to each other about a junction and that are provided with (1) inner elongated grooves radiating from the junction for the snug reception of the similarly located terminals of the chip, (2) openings through which the clip communicates with the grooves to guide probes into direct contact with selected terminals, and (3) indicia at the openings for facilitating accurate terminal selection while precluding inadvertent probe and terminal contacts.

7 Claims, 5 Drawing Figures

U.S. Patent           October 25, 1977           4,055,800
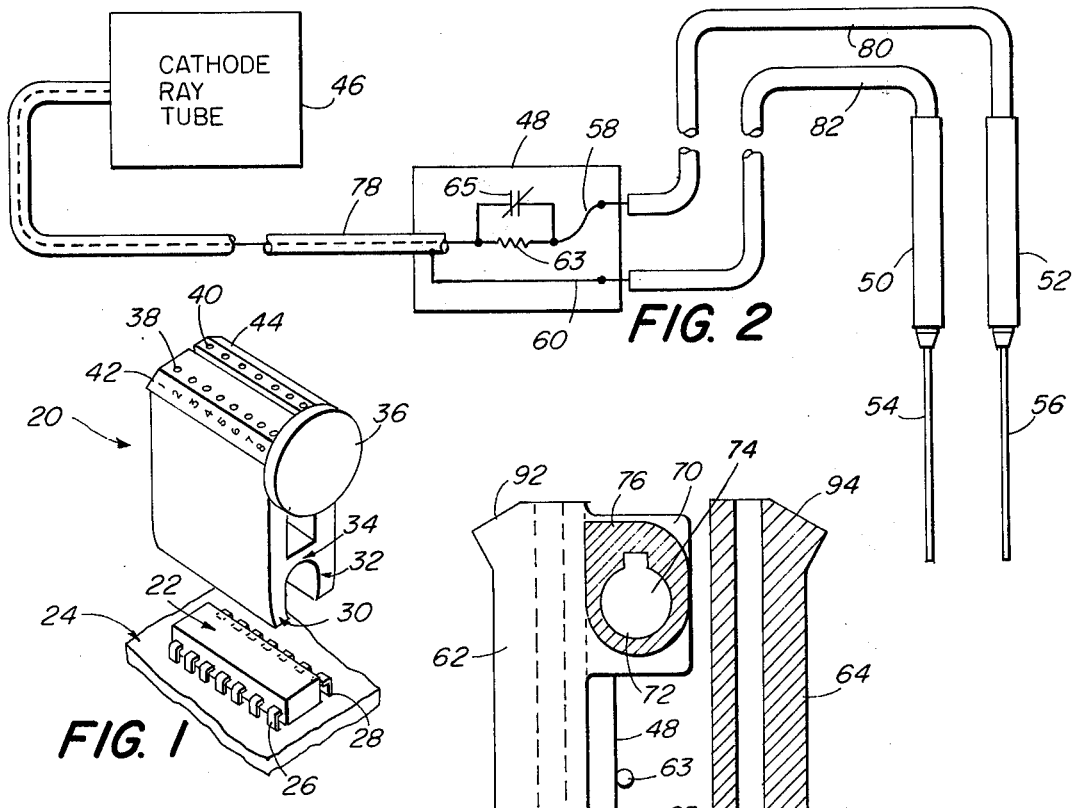
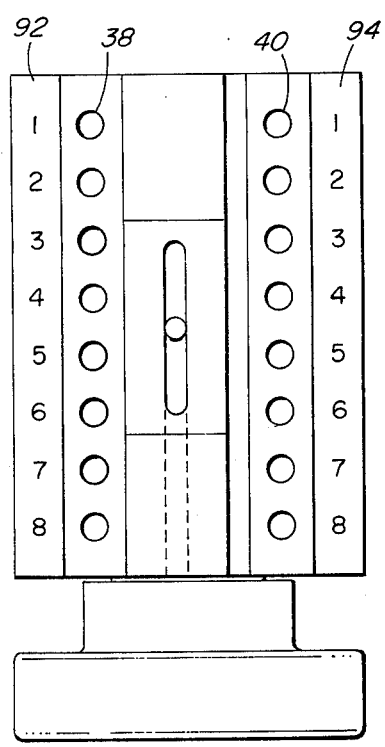
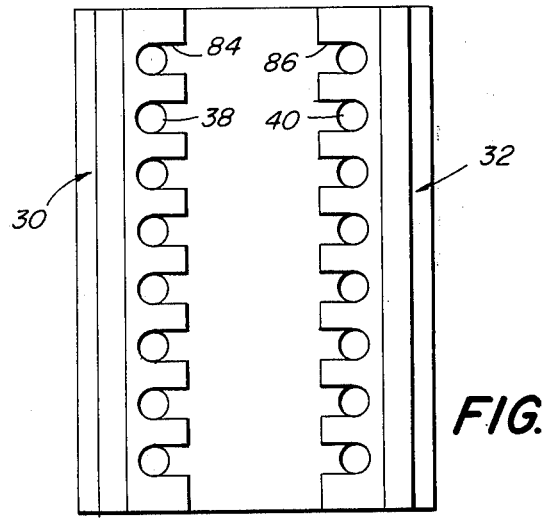

TEST CLIP FOR ELECTRONIC CHIPS

BACKGROUND

1. Field of the Invention

The present invention relates to a test clip for connection to the leads of an electronic chip, particularly a dual inline plastic (DIP) chip, in which an integrated circuit or the like is encapsulated and at the opposed edges of which the leads are positioned to enable connection to a printed circuit board or the like. More particularly, the present invention relates to a test clip for guiding the test probes of a cathode ray tube or the like into contact with selected terminals of a dual inline plastic electronic chip, such terminals being very closely spaced together.

2. The Prior Art

Prior test clips for dual inline plastic electronic chips have suffered from insecure clamping of the chip by the clip, precarious contact between the probes and the terminals, and a requirement of critical manual dexterity.

SUMMARY OF THE INVENTION

The primary object of the present invention is to provide an integral plastic chip comprising a pair of opposed jaws that are pivotal relative to each other about a junction and that are provided with (1) inner elongated grooves radiating from the junction for the snug reception of the similarly located terminals of a dual inline chip, (2) openings through the clip communicating with the grooves to guide probes into direct contact with selected terminals, and (3) indicia at the openings for facilitating accurate terminal selection while precluding inadvertent probe and terminal contacts. In the preferred embodiment, positive gripping of the chip by the jaws is effected by a rotatable cam and the clip carries an attenuator circuit board, which is connected permanently to a cathode ray tube and to a pair of probes for correct matching.

Other objects of the present invention will in part be obvious and will in part appear hereinafter.

The invention accordingly comprises the products, together with its components and their interrelationships, which are shown in the present disclosure, the scope of which will be indicated in the appended claims.

BRIEF DESCRIPTION OF THE DRAWINGS

For a fuller understanding of the nature and objects of the present invention, reference is made to the following detailed description, which is to be taken in connection with the accompanying drawings, wherein:

FIG. 1 is a perspective view of a dual inline chip and a test clip of the present invention for attachment to it;

FIG. 2 is a schematic of the electrical components that are associated with the test clip of FIG. 1;

FIG. 3 is an end elevation of the test clip of FIG. 1, with parts broken away;

FIG. 4 is a top plan view of the test clip of FIG. 1; and

FIG. 5 is a bottom plan view of the test clip of FIG. 1, with parts omitted.

DETAILED DESCRIPTION OF THE PREFERRED EMBODIMENT

As shown in FIG. 1, a test clip 20 is shown above a dual inline plastic chip 22, which is connected into a printed circuit board 24. Chip 22 is shown as having seven terminals 26 along one edge and seven terminals 28 along the opposite edge. As shown these terminals have portions that extend at right angles to the plane of printed board 24 and into openings in printed circuit board 24 for soldered connections, with remaining circuitry. Encapsulated within chip 22 is a particular microelectronic circuit. It is desired to test chip 22 by contacting terminals 26, 28 selectively with the probes of a cathode ray tube. Test clip 20 facilitates this objective.

Test clip 20 comprises a pair of clamp elements 30, 32 and a hinge element 34 that joins clamp elements 30, 32. Clamp elements 30, 32 and hinge element 34 are composed integrally of polycarbonate or polypropylene or the like, clamp elements 30, 32 being relatively thick and hinge element 34 being relatively thin. In consequence, clamp elements 30, 32 are relatively rigid and hinge element 34 is relatively flexible. In a manner that will become aparent below, clamp elements 30, 32 include lower jaw portions 66, 68, which are designed to seat and lock upon chip 22, and upper lever portions 62, 64, which can be biased outwardly or released inwardly by rotation of a knob 36. The locking and unlocking of the jaw portions is controlled by the outward bias or inward release of lever portions 62, 64. When clip 20 is affixed to chip 22 in the foregoing manner, a pair of probe terminals 54, 56 can be inserted into selected openings of two parallel arrays of openings 38, 40 into contact with selected terminals 26, 28. Openings 38, 40 guide the probes into contact with terminals 26, 28 in such a way that, when the probes contact the terminals, they cannot contact each other and in such a way that a probe can contact only a single terminal at any given time. In order to facilitate terminal selection, openings 38, 40 are provided with indicia 42, 44.

FIG. 2 illustrates the electrical components, with which the mechanical components of clip 20 are associated. Clip 20 is intended for use with: a cathode ray tube 46 for displaying the results of testing chip 22; a printed circuit board 48 which, as shown in FIG. 3 is carried by clip 20; and a pair of probes 50, 52, having previously mentioned terminals 54, 56, which are designed for insertion through holes 38, 40 into contact with selected terminals 26, 28. As shown, printed circuit board 48 includes two electrical paths 58, 60, respectively extending between the terminals of cathode ray tube 46 and terminals 54, 56 of probes 50, 52. Path 58 incorporates an attentuator including a resistor 63 and a capacitor 65 in parallel. Attentuator 63, 65 serves to match the electrical components of clip 20 with the circuitry of cathode ray tube 46 in order to compensate for any spurious signals resulting from the presence of clip 20 and terminals 54, 56.

Mechanical details of the clip are shown in FIGS. 3, 4 and 5. As previously indicated, clamp elements 30, 32 are relatively thick compared to hinge element 34. In consequence, hinge element 34 acts as a pivot about an axis that extends perpendicularly to the axes of holes 38, 40. As shown, the lengths of lever portions 62, 64, from hinge 34 to their upper extremities, is greater than the lengths of jaw portions 66, 68, from hinge 34 to their lower extremities. Thus, lever portions 62, 64 provide mechanical advantage to exert pressure between jaw portions 66, 68. Extending integrally from lever portion 62 into proximity but not into contact with lever portion 64 is a bearing mount 70. In bearing mount 70 is an opening 72 which has an axis that is generally parallel to the axis of hinge 34. Extending through opening 72 is a shaft 74, at one end of which is knob 36 and at the other end of which is a cam 76. In the operative condition of knob 36, cam 76 bears against lever portion 64 in order to urge jaw portion 68 toward jaw portion 66. In the inoperative condition of knob 36, cam 76 is free of lever portion 64 so as to relieve pressure between jaw portions 66, 68.

As shown, printed circuit board 48 is located in the region between lever portions 62, 64 and is affixed to lever portion 62 between bearing mount 70 and hinge 34. One of the cables extending from printed circuit board 48 is shown at 78. As indicated above, two additional cables, shown in FIG. 2 at 80, 82, extend from printed circuit board 48 to probes 50, 52. As shown in FIG. 5, the undersides of jaw portions 66, 68 are provided with two parallel rows of open ended slots 84, 86, which are of sufficient width to seat upon terminals 26, 28 and which are correctly spaced so that all of slots 84, 86 seat upon all of terminals 26, 28. Rows of openings 38, 40 extend from positions at the upper extremities of lever portions 30, 32 to the lower extremities of jaw portions 30, 32, into communication with slots 84, 86. Adjacent to the upper extremities of openings 88, 90 are bevelled faces 92, 94, which carry indicia 42, 44.

OPERATION

In operation, knob 36 of clip 20 is rotated until the lever portions 62, 64 of clamp elements 30, 32 can be compressed toward each other by the thumb and forefinger of the hand. Next, the clip is fitted over dual inline plastic chip 22, with grooves 84, 86 in registration with terminals 26, 28. Next, knob 36 is rotated until cam 76 bears against lever portion 64 in order to clamp jaw portions 66, 68 together in secure fastening relation to chip 22. Next, probes 54, 56 are inserted into selected holes of series 38, 40 in such a way that the probes come into contact with selected terminals of series 26, 28. Capacitor 65 initially is adjusted to reduce error to a minimum. Then, the test results presented by cathode ray tube 46 are observed or photographed. Finally, after the test procedure, knob 36 is rotated to disengage cam 76 from lever portion 64 in order to release portions 66, 68 from chip 22.

Since certain changes may be made in the foregoing disclosure without departing from the scope of the invention herein, it is intended that all matter contained in the foregoing disclosure of shown in the accompanying drawings be interpreted in an illustrative and not in a limiting sense.

What is claimed is:

1. A clip for attachment to electronic chips in order to permit testing thereof, said clip comprising:
   a. an integral polymeric body including a pair of clamp elements and a hinge element, said clamp elements being relatively thick for rigidity and said hinge elements being at least partially relatively thin for flexibility along an axis;
   b. said clamp elements being pivotable with respect to each other about said axis and having lever portions extending generally away from said axis in one direction and jaw portions extending generally away from said axis in the opposite direction;
   c. at least one of said lever portions carrying means for biasing said lever portions away from each other into operative condition and for permitting said lever portions to move toward each other into inoperative condition;
   d. said jaw portions having a plurality of open ended slots for seating upon the terminals of said electronic chip;
   e. said lever portions having a series of openings extending from the outer extremities of said lever portions to the outer extremities of said jaw portions into communication with said slots; and
   f. said means for biasing including manually operable control means.

2. The clip of claim 1 wherein said means for biasing includes a bearing of one of said lever portions, a shaft journalled in said bearing, a knob and a cam on said shaft, the rotational position of said knob controlling the rotational condition of said cam, said shaft bearing against the other of said lever portions when said knob is in operative condition, said lever being free of the other of said lever portions when said knob is in inoperative condition.

3. A clip for attachment to electronic chips in order to permit testing thereof, said clip comprising:
   a. an integral polymeric body including a pair of clamp elements and a hinge element, said clamp elements being relatively thick for rigidity and said hinge elements being at least partially relatively thin for flexibility along an axis;
   b. said clamp elements being pivotable with respect to each other about said axis and having lever portions extending generally away from said axis in one direction and jaw portions extending generally away from said axis in the opposite direction;
   c. at least one of said lever portions carrying means for biasing said lever portions away from each other into operative condition and for permitting said lever portions to move toward each other into inoperative condition, said means for biasing including manually operable control means;
   d. said jaw portions having a plurality of open ended slots for seating upon the terminals of said electronic chip;
   e. said lever portions having a series of openings extending from the free extremities of said lever portions to the free extremities of said jaw portions into communication with said slots;
   f. indicia extending along the upper extremities of said lever portions adjacent to said openings;
   g. circuit means including two probes for projection through selected ones of said openings into contact with selected ones of said terminals;
   h. said circuit means including an attenuator circuit, said attenuator circuit being mounted on said clip;
   i. said attenuator circuit including a variable capacitor and a resistor in parallel;
   j. said circuit means defining two electrical paths for connecting said two probes permanently to a cathode ray tube.

4. The clip of claim 3 wherein said means for biasing includes a bearing on one of said lever portions, a shaft journalled in said bearing, a knob and a cam on said shaft, the rotational position of said knob controlling the rotational condition of said cam, said shaft bearing against the other of said lever portions when said knob is in operative condition, said lever being free of the other of said lever portions when said knob is in inoperative condition.

5. The clip of claim 3 wherein said circuit means includes an attenuator circuit, said attenuator circuit being mounted on said clip.

6. The clip of claim 5 wherein said attenuator circuit includes a variable capacitor and a resistor in parallel.

7. The clip of claim 3 wherein said circuit means defines two electrical paths for connecting said two probes permanently to a cathode ray tube.

* * * * *